US006652727B2

(12) United States Patent
Taylor et al.

(10) Patent No.: US 6,652,727 B2
(45) Date of Patent: *Nov. 25, 2003

(54) SEQUENTIAL ELECTRODEPOSITION OF METALS USING MODULATED ELECTRIC FIELDS FOR MANUFACTURE OF CIRCUIT BOARDS HAVING FEATURES OF DIFFERENT SIZES

(75) Inventors: E. Jennings Taylor, Troy, OH (US); Jenny J. Sun, Tipp City, OH (US); Maria E. Inman, Yellow Springs, OH (US)

(73) Assignee: Faraday Technology Marketing Group, LLC, Troy, OH (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/132,399

(22) Filed: Apr. 26, 2002

(65) Prior Publication Data

US 2003/0010642 A1 Jan. 16, 2003

Related U.S. Application Data

(63) Continuation-in-part of application No. 09/823,750, filed on Apr. 3, 2001, now abandoned, which is a continuation-in-part of application No. 09/419,881, filed on Oct. 18, 1999, now Pat. No. 6,309,528.
(60) Provisional application No. 60/159,541, filed on Oct. 15, 1999.

(51) Int. Cl.$^7$ .................................................. C25D 5/18
(52) U.S. Cl. ...................... 205/103; 205/123; 205/125; 205/157; 205/136
(58) Field of Search ................................ 205/103, 107, 205/123, 125, 157, 118, 131, 136

(56) References Cited

U.S. PATENT DOCUMENTS

| | | | | | |
|---|---|---|---|---|---|
| 4,666,567 | A | * | 5/1987 | Loch | 205/83 |
| 5,489,488 | A | * | 2/1996 | Asai et al. | 428/611 |
| 5,972,192 | A | * | 10/1999 | Dubin et al. | 205/101 |
| 6,309,528 | B1 | * | 10/2001 | Taylor et al. | 205/103 |

* cited by examiner

*Primary Examiner*—Roy King
*Assistant Examiner*—Wesley A. Nicolas
(74) *Attorney, Agent, or Firm*—Thompson Hine LLP

(57) ABSTRACT

A continuous layer of a metal is electrodeposited onto a substrate having both hydrodynamically inaccessible recesses and hydrodynamically accessible recesses on its surface by a two-step process in which the hydrodynamically inaccessible recesses are plated using a pulsed reversing current with cathodic pulses having a duty cycle of less than about 50% and anodic pulses having a duty cycle of greater than about 50% and the hydrodynamically accessible recesses are then plated using a pulsed reversing current with cathodic pulses having a duty cycle of greater than about 50% and anodic pulses having a duty cycle of less than about 50%.

57 Claims, 4 Drawing Sheets distance from the cathode

SEQUENTIAL ELECTRODEPOSITION OF METALS USING MODULATED ELECTRIC FIELDS FOR MANUFACTURE OF CIRCUIT BOARDS HAVING FEATURES OF DIFFERENT SIZES

RELATIONSHIP TO OTHER APPLICATIONS

The application is a continuation-in-part application of application Ser. No. 09/823,750 filed Apr. 3, 2001, now abandoned, which is a continuation-in-part of application Ser. No. 09/419,881, filed Oct. 18, 1999, now U.S. Pat. No. 6,309,528, and also claims the benefit of U.S. Provisional Patent Application No. 60/159,541, filed Oct. 15, 1999.

BACKGROUND OF THE INVENTION

1 Field of the Invention

This invention relates to electrodeposition of metals and more particularly to electrochemical metallization of substrates having surface features of different transverse dimensions.

2 Brief Description of the Prior Art

Electronic devices such as computers, cellular telephones, electronic entertainment devices, and the like, have long been manufactured by mounting components on circuit boards having electrically conductive traces thereon to interconnect the components.

In the manufacture of such electronic equipment, development of technology and economics have driven the industry toward ever-smaller devices, containing ever-increasing numbers of components. At the level of semiconductor devices very large scale integration (VLSI) and ultra large scale integration (ULSI), hereafter referred to as simply VLSI, has produced chips containing up to a few million transistors on a single semiconductor chip no larger than several millimeters a side. Such chips have conventionally been packaged or encapsulated in small modules having external lead wires for interconnecting the chips. The interconnections have conventionally been provided by circuit boards having electrical conductors prepared by so called "printed wiring" techniques that involve masking, etching, and plating of conductive metal, usually copper, to provide the interconnects between chip modules or sockets designed to hold such modules. These "printed wiring boards" (PWB) have typically been used to interconnect chips of conventional sizes. The chips or socket are mounted on the surface of the board with terminals fitted into holes through the board. The holes are typically lined with a thin layer of copper that is integral with the traces of copper on the surface of the board. The terminals of the chips or sockets are soldered to the copper layer lining the holes and thereby interconnected through the copper traces. The PWBs may have copper traces on both sides as well as more than one inner layer of copper traces. Connections between copper traces in the different layers of these double-sided and multilayered PWBs are also provided by copper-lined holes passing through the board, commonly known as plated through-holes (PTHs).

The copper lining in such holes is typically applied electrolytically, by first laying down a thin layer of electroless copper to provide electrical continuity and then electroplating copper to a thickness of a few mils to provide the connecting layer. While the copper could be applied solely using the electroless process, the processing time for the electroless process is significantly greater than the processing time for the electrolytic process. The holes in the PWBs typically are at least 12–13 mils in diameter. Because of the well-known problem of depositing metal electrolytically in recesses, special techniques have to be used to assure that a uniform layer of conductive metal is deposited in the holes. Consequently conventional techniques to enhance the "throwing power" of the electroplating system have been employed, such as agitation of the bath, addition of certain chemical compounds to the electroplating bath, and/or the use of pulsed current plating. Furthermore, while a full-build electroless process can somewhat alleviate the throwing power issue associated with the electrolytic process, the added processing time reduces throughput.

Although conventional techniques have generally been successful in the manufacture of PWBs having the dimensions that have been commonly used in electronic devices such as television receivers, personal computers, and the like, the trend to ever smaller equipment such as cellular telephones, palm computers, portable global positioning devices, more advanced computers, and the like, has led to the necessity of mounting chips closer together in multichip modules (MCMs). Instead of terminals extending into holes in the circuit board, such MCMs frequently have only metallized locations on a major surface of the module to provide interconnections. The semiconductor devices or chips are placed relatively close together on a substrate having holes drilled therein at the locations of the interconnecting pads on the modules. In such boards the holes are typically of smaller diameter than those of conventional PWBs, and may range from about 25 micrometers (1 mil) to about 250 micrometers (10 mils). Such holes are also effectively blind holes and the conductor deposition step provides the electrical contact to the terminal pads on the semiconductor devices as well as the interconnections between the devices. The use of small chips mounted close together and interconnected by means of conductors deposited in small holes has come to be known as high density interconnect (HDI) technology. With single sided, double sided and multilayers representing the first three generations of PWBs, high density PWBs are also being termed the fourth generation PWB. Other names for this emerging technology includes built-up boards and micro via boards. Other designs for these built up boards involves adding the chip subsequent to processing.

Furthermore, circuit boards having areas of high-density interconnections between micro via layers on either side of the PWB and conventional PWB layers or to semiconductor devices also must have structures adapted to connect the HDI board to other boards or peripheral devices. Such external connections to devices of conventional size are generally made using conventional PWB techniques, e.g., using plated-through holes. Accordingly, a single circuit board level or layer may include both areas of high-density interconnects and areas of conventional PWB connections.

As pointed out above, it has been found that the electroplating conditions suitable for fabricating plated through holes (PTHs) are not effective to deposit metal into the smaller blind holes and vias found in the HDI areas of the board. Accordingly, the conventional procedure for manufacture of such boards has been to mask either the HDI area or the conventional PTH area of the board and plate each area under conditions appropriate for the size of the holes and recesses in the board. Typically, the full-build electroless approach is utilized with the concomitant lengthy processing time and slow throughput. Further, the conditions have included special additives in the plating bath to improve the throwing power in order to promote the deposition of metal in the recesses, vias and holes. The requirement for masking certain areas of the board surface has introduced a number of processing steps, such as applying a photoresist layer, imaging the layer, developing the photoresist, and at least two separate electroplating steps, possibly in baths of different compositions. Deposition of conductive metal into the small, blind holes or vias used in HDI has presented particular problems. Conventional metallization procedures, such as chemical vapor deposition or physical vapor deposition as well as electroless deposition, are slow and expensive. Electroplating into small blind vias using conventional procedures has not been able to provide a reliable layer of conductive metal in the vias to assure a reliable interconnection of the chips. Such a reliable layer of conductive metal may either be conforming to the via, that is conformal, or in some cases it may be desirable to fill the via. In particular, conventional electroplating techniques tend to deposit excess metal at the sharp corners at the top or entrance of the hole. Such deposits encroach on the opening of the hole and hinder deposition in the lower portion of the hole. They may even completely block the mouth of the hole leading to voids in the vias or interconnects. Furthermore, chemical additives in the plating bath may lead to inclusions of impurities derived from the plating bath within the metal deposit. Such problems can lead to connections that have a high electrical resistance and are mechanically brittle and unreliable in service. In addition, the use of nonconventional electroplating techniques such as pulse current plating, typically in conjunction with chemical additives, has relied on waveform parameters successfully developed for traditional PWB applications, such as 13 mil and greater PTHs. These waveforms Generally operate with long cathodic duty cycles and short anodic duty cycles. This approach has led to similar problems encountered in conventional plating with excess metal deposit at the opening of the via leading to voids in the interconnect or to excessive deposit of metal on the surface of the substrate, a condition known to those in the industry as overplate. As well as wasting copper, overplate limits how close features may be placed and is counter to the objective of attaining higher packing densities. In addition to the problems cited above, such nonuniform metallization within the via or between the via and the substrate results in excessive processing time and cost associated with the excess metal.

Accordingly, a need has continued to exist for a method of depositing metallic conductors, especially copper, onto the surface of high-density interconnect boards with adequate deposition of metal into the small vias and recesses of the HDI areas as well as the through holes of the external connection areas.

SUMMARY OF THE INVENTION

The problems of providing adequate metallization of both HDI areas and peripheral connect areas of HDI circuit boards have now been alleviated by the process of this invention, wherein conductive metal is deposited in both the relatively small features of the HDI area and the larger features of the peripheral connect area in a single plating bath. The metal is deposited in the vias, holes and recesses of the HDI area using a first modulated reversing electric current comprised of relatively short cathodic pulses and relatively long anodic pulses. The larger features of the peripheral connect area are plated using a second modulated reversing electric current comprised of relatively long cathodic pulses and relatively short anodic pulses.

Accordingly, it is an object of the invention to provide an electrochemical method for metallizing a substrate having both high-density interconnect areas and conventional printed wiring board areas.

A further object is to provide a method for electrodeposition of a metal into the small recesses of a high density interconnect area as well as in the through holes of a conventional printed wiring board area.

A further object is to provide a method for metallizing high density interconnect areas and printed wiring board areas in a single electroplating bath.

A further object is to provide a method for metallizing high density interconnect areas and printed wiring board areas without masking the areas for separate plating steps.

A further object is to provide a method for metallizing high density interconnect areas and printed wiring board areas without excessive deposition of metal on the surface of the substrate.

Further objects of the invention will become apparent from the description of the invention which follows.

DETAILED DESCRIPTION OF THE INVENTION AND PREFERRED EMBODIMENTS

Figure 1:
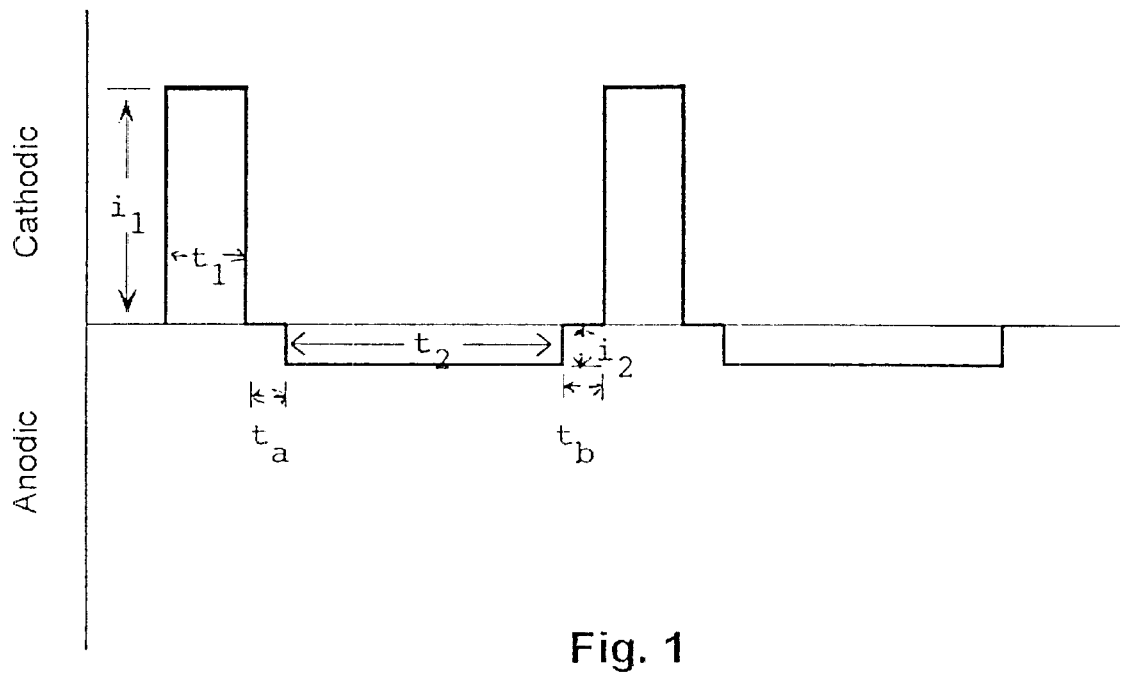
FIG. 1 illustrates the waveform of a modulated reverse electric current used for metallizing the HDI areas of a circuit board in the first step of the method of the invention.

The method of the invention makes use of the ability to control the deposition of metal into small recesses can be controlled by using a modulated reverse electric field that produces a pulsed reversing current. In general, when pulsed reversing current is used to electroplate a metal on a substrate, a cathodic pulse is applied to the substrate to produce reduction of metal ions and deposition of metal on the substrate. A following anodic pulse may produce oxidation reactions at the substrate, e.g., oxidation of hydrogen produced by the preceding cathodic pulse, and may cause some dissolution of the metal deposited during the cathodic pulse. In addition, the cathodic and anodic pulses may effect the adsorption and desorption phenomena of the various components of the plating bath such as additives and the like. By adjusting the duration, frequency and duty cycle of the anodic and cathodic pulses it is possible to produce a net deposition of metal at selected locations on the substrate. In particular, it is possible to direct the metal into small recesses in the surface or to a general coverage of the surface and large recesses and/or holes in the substrate.

It is believed that the preferential electrodeposition of a metal into relatively small recesses is related to the relative dimensions of the recess and the Nernst diffusion layer, which develops in the electrolyte close to the surface of the substrate. Because the concentration of metal ions in the electrolyte contacting the substrate is depleted by deposition onto the substrate, a concentration gradient develops in the layer of electrolyte adjacent to the substrate surface. In this layer (the Nernst diffusion layer), having a thickness $\delta$, mass transport of metal ions from the bulk electrolyte to the surface takes place by diffusion. The thickness of the Nernst diffusion layer is determined by the vigor of the hydrodynamic agitation of the plating bath, and accordingly its thickness is subject to considerable variation. Under conventional average conditions of agitation in industrial electroplating, the thickness $\delta$ of the Nernst diffusion layer has been determined to be about 75 micrometers. Although the Nernst diffusion layer generally conforms to the profile of the substrate surface, it is evident that for small recesses, i.e., those having transverse dimensions of the order of the thickness of the diffusion layer, or more specifically two times the thickness of the diffusion layer, the layer cannot follow the surface profile. Consequently, these recesses, wherein the metal ions to be deposited must diffuse over distances that are greater than the hydrodynamically defined Nernst diffusion layer, may be said to hydrodynamically inaccessible to the bulk electrolyte. Conversely, those portions of the substrate profile, including larger recesses and holes, wherein the plated metal ions have to traverse only the thickness of the Nernst diffusion layer may be said to be hydrodynamically accessible to the bulk electrolyte.

Evidently, the boundary between hydrodynamically accessible and hydrodynamically inaccessible recess in a substrate surface depends somewhat on the degree of agitation of the electrolyte bath. In conventional electroplating practice, where the thickness of the Nernst diffusion layer may be about 75–100 micrometers, recesses having a transverse dimension of the order of twice the thickness of the Nernst diffusion layer, or perhaps somewhat greater, may be considered to be hydrodynamically accessible to the bulk electrolyte. Consequently, small recesses having transverse dimensions less than about 200–250 micrometers, or perhaps 350 micrometers at the outside, are hydrodynamically isolated. Furthermore, those recesses having relatively large aspect ratios will tend to be relatively hydrodynamically inaccessible, because the diffusion layer simply cannot follow the surface profile. Conversely, recesses having transverse dimensions greater than about 200–250 micrometers may be ordinarily considered to be hydrodynamically accessible to the bulk electrolyte. Although the size limits separating the hydrodynamically inaccessible recesses from the hydrodynamically accessible ones cannot be defined in absolute dimensions, in a given case the dimensional boundary between the hydrodynamically accessible recesses and those that are hydrodynamically inaccessible can be determined, at least by the results of electroplating experiments. Furthermore, in the case of circuit boards having areas of high density interconnections, with relatively small vias, e.g., 75–250 micrometers, and peripheral areas having through-holes and similar features with somewhat larger dimensions, e.g., about 350 micrometers (13–14 mils), the differences between the hydrodynamically accessible and inaccessible features will be evident.

In any case, it is according to one embodiment of the invention to plate the hydrodynamically inaccessible recesses in a first electroplating step using a first pulsed reversing current or pulse train having a relatively short cathodic duty cycle, e.g., less than about 50%, and a relatively long anodic duty cycle, i.e., greater than about 50%. After the hydrodynamically inaccessible recesses, e.g., small vias and holes have been conformally plated or filled with deposited metal, the hydrodynamically accessible recesses and holes are plated with a uniform layer of deposited metal using a second pulsed reversing current or pulse train having a relatively long cathodic duty cycle, i.e., greater than about 50%, and a relatively short anodic duty cycle, i.e., less than about 50%.

In the first step of the process of the invention, a layer of metal, e.g., copper is deposited selectively in the small blind vias of a circuit board having an area of high density interconnections. The procedure is disclosed in copending U.S. patent application Ser. No. 09/231,811 the entire disclosure of which is incorporated herein by reference. The small features plated in the first step of the process of the invention typically have transverse dimensions less than about 350 micrometers, typically between about 5 micrometers and 350 micrometers, and more typically from about 10 micrometers to about 250 micrometers, or from about 25 micrometers to about 250 micrometers, or from about 50 micrometers to about 150 micrometers.

A schematic representation of a rectangular modulated reverse electric field waveform used in the first step of the process of the invention is illustrated in FIG. 1. The waveform essentially comprises a cathodic (forward) pulse followed by an anodic (reverse) pulse. An off-period or relaxation period may follow either or both of the cathodic and anodic pulses. Those skilled in the art will recognize that the voltage and current will be proportional under the circumstances of the electrolytic process of the invention. Accordingly, the ordinate in FIG. 1 could represent either current or voltage. Although it is generally more convenient in practice to control the current, alternatively the voltage may be controlled. The technical disclosure of the process is more straightforward if discussed in terms of the current flow. Furthermore, the waveform need not be rectangular as illustrated. The cathodic and anodic pulses may have any voltage-time (or current-time) profile. In the following discussion rectangular pulses are assumed for simplicity. Again, one skilled in the art will recognize that the point in time chosen as the initial point of the pulse train is entirely arbitrary. Either the cathodic pulse or the anodic pulse (or any point in the pulse train) could be considered as the initial point. The representation with the cathodic initial pulse is introduced for simplicity in discussion.

In FIG. 1, the cathodic peak current is shown as $i_1$ and the cathodic on-time is $t_1$. Similarly, the anodic peak current is shown as $i_2$ and the anodic on-time is $t_2$. The relaxation time, or off-times are indicated by $t_a$ and $t_b$. The sum of the cathodic on-time, anodic on-time, and off-times (if present) is the period T of the pulse train ($T = t_1 + t_2 + t_a + t_b$), and the inverse of the period of the pulse train (1/T) is the frequency (f) of the pulse train. The ratio of the cathodic on-time to the period ($t_1/T$) is the cathodic duty cycle ($D_1$), and the ratio of the anodic on-time to the period ($t_2/T$) is the anodic duty cycle ($D_2$). The current density, i.e., current per unit area of the electrode, during the cathodic on-time and anodic on-time is known as the cathodic peak pulse current density and anodic peak pulse current density, respectively. The cathodic charge transfer density ($Q_1$) is the product of the cathodic current density and the cathodic on-time ($i_1 T_1$), while the anodic charge transfer density (Q2) is the product of the anodic current density and the anodic on-time ($i_2 T_2$). The average current density ($I_{ave}$) is the average cathodic current density ($D_1 I_1$) minus the average anodic current density ($I_2 D_2$). Accordingly the relationships among the parameters may be represented by the following equations.

$$T = \frac{1}{f} = t_1 + t_2 + t_a + t_b \quad (1)$$

$$D_1 = \frac{t_1}{T} \quad (2)$$

$$D_2 = \frac{t_2}{T} \quad (3)$$

$$\frac{Q_1}{Q_2} = \frac{i_1 t_1}{i_2 t_2} \quad (4)$$

$$I_{ave} = i_1 D_1 - i_2 D_2 \quad (5)$$

$$D_1 + D_2 1 \quad (6)$$

The cathodic duty cycle in the first step of the process of the invention should be relatively short, less than about 50%, and the cathodic pulses should be relatively short, to favor uniform deposition of metal on both the concave (trenches) and convex (peaks) portions of the substrate surface as well as flat portions of the surface. Preferably, the cathodic duty cycle is from about 30% to about 1%, more preferably from about 30% to about 15% and still more preferably from about 30% to about 20%.

Conversely, the anodic duty cycle should be relatively long, greater than about 50%, and the anodic pulses should be relatively long in order to favor removal of excess metal from the convex and peak portions of the substrate surface and the flat portions of the surface. Preferably, the anodic duty cycle is from about 60% to about 99%, more preferably from about 70% to about 85% and still more preferably from about 70% to about 80%. Because the anodic duty cycle is longer than the cathodic duty cycle, the peak anodic voltage (and corresponding current) will be less than the peak cathodic voltage (and corresponding current). Accordingly, the cathodic-to-anodic net charge ratio will be greater than one, in order to provide a net deposition of metal on the surface. Although the anodic removal of excess metal reduces the overall efficiency of the electroplating process, the benefits of filling or uniformly coating the trenches or blind vias required for high density interconnects provide great advantages in the manufacturing process.

The frequency of the first pulse train used in the method of the invention may range from about 5 Hertz to about 12000 Hertz, preferably from about 100 Hz to about 10000 Hz, more preferably from about 200 Hz to about 4000 Hz, and still more preferably from about 200 Hz to about 2000 Hz. Accordingly, the cathodic and anodic pulse widths may vary from about 0.83 microsecond to about 200 milliseconds. Generally, as the feature size decreases or the aspect ratio increases, higher frequencies and or lower cathodic duty cycles are preferred. An anodic pulse is introduced between at least some of the cathodic pulses. However, it is not excluded that two or more cathodic pulses may be introduced between a pair of anodic pulses. In particular, a plurality of very short cathodic pulses may be followed by one relatively long anodic pulse. Accordingly, a number of cathodic and anodic pulses with defined pulse widths may make up one group of pulses, which is then repeated. Typically such a group would include one or more cathodic pulses and at least one anodic pulse. The period of a pulse train comprised of such pulse groups may conveniently be defined as the time from the beginning of one cathodic pulse to the beginning of the next cathodic pulse that is similarly situated in the pulse train. The frequency of the pulse train may then be defined as the reciprocal of the period, as discussed above.

The pulse width, duty cycle, and applied voltage of the cathodic and anodic pulses must be adjusted, within the parameters defined for the first pulse train of the process, to provide that the overall process is cathodic, i.e., there is a net deposition of metal on the substrate workpiece. The practitioner will adapt the pulse width, duty cycle, and frequency to a particular application, based on the principles and teachings of the process of the invention.

In the second step of this embodiment of the process of the invention, metal is deposited uniformly over the relatively large features of the substrate and in the through holes that are typically found in circuit board substrates. The waveform of the pulsed reversing current is selected to produce this uniform deposit over the relatively large features.

Figure 2:
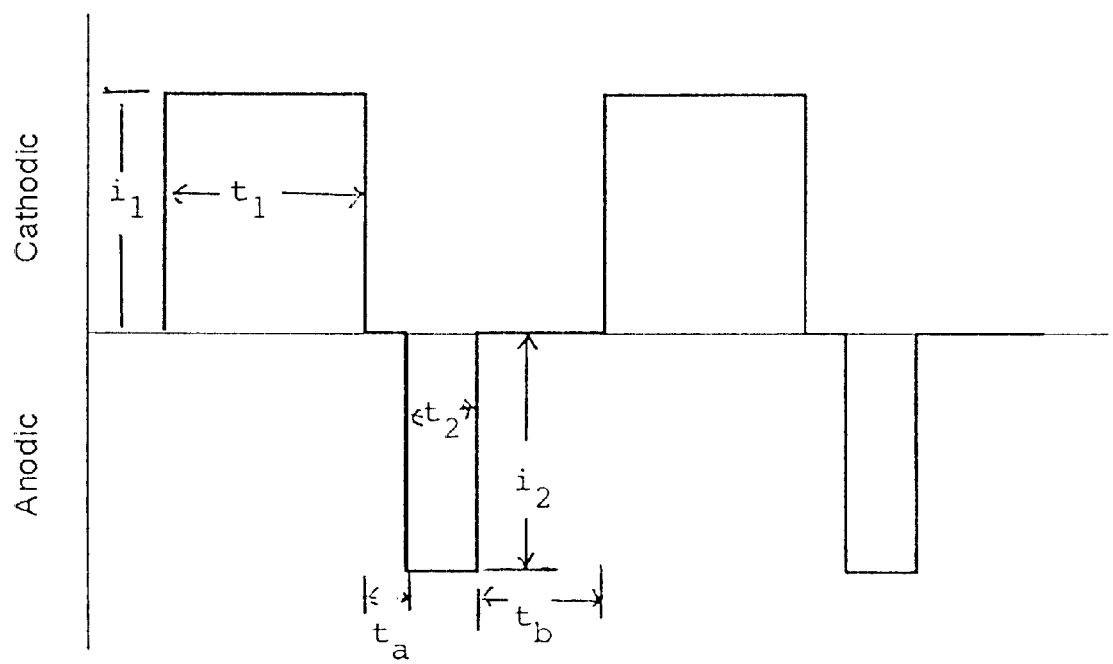
FIG. 2 illustrates the waveform of a modulated reverse electric current used in metallizing the printed wiring board areas of a circuit board in the second step of the method of the invention.

A schematic representation of a rectangular modulated reverse electric field waveform used in the second step of the process of the invention is illustrated in FIG. 2. The definitions of the relevant parameters of the pulse train have been set forth above. In the second step of the process, the cathodic pulse is relatively long and the anodic pulse is relatively short. The relatively long cathodic pulses will deposit metal uniformly over the large features. Such pulses tend to deposit an excess of metal at the corners and peak portions of the substrate. They also tend to deposit excess metal at the corners of the through holes, yielding a so-called "dog-bone" profile.

The relatively short anodic pulses in the second step of this embodiment tend to remove metal from the corners and peaks of the substrate, thereby compensating for the overplating produced by the cathodic pulses. The result is a smooth uniform coating of metal over the relatively large features of the substrate. Typically, the waveform used in the second step of the plating process of the invention will deposit a uniform coating of metal over features having transverse dimensions of about 350 micrometers or greater, or under some circumstances having features greater than about 250 micrometers. Such dimensions are typical of the through-holes of conventional circuit boards and of the holes placed in the peripheral connecting portions of high density interconnect circuit boards.

Accordingly, the cathodic duty cycle in the second pulse train of the process of the invention is relatively long, more than about 50%, and the anodic pulses should be relatively short, less than that of the cathodic pulse and preferably less than about 50%. Preferably, the cathodic duty cycle is from about 60% to about 99%, more preferably from about 70% to about 95% and still more preferably from about 80% to about 95%.

Conversely, the anodic duty cycle should be relatively short, less than about 50%, and the anodic pulses should be relatively short in order to favor removal of excess metal from the convex and peak portions of the substrate surface. Preferably, the anodic duty cycle is from about 40% to about 1%, more preferably from about 30% to about 5% and still more preferably from about 20% to about 5%. Because the anodic duty cycle is shorter than the cathodic duty cycle, the peak anodic voltage (and corresponding current) may be greater than the peak cathodic voltage (and corresponding current). In any case, the cathodic-to-anodic net charge ratio is adjusted to be greater than one, in order to provide a net deposition of metal on the surface. Although the anodic removal of excess metal reduces the overall efficiency of the electroplating process, the benefits of obtaining a uniform coating over the surface and the through-holes provides a benefit to the manufacturing process.

The frequency of the second pulse train used in the method of the invention may range from about 5 Hertz to about 4000 Hertz, preferably from about 10 Hz to about 2500 Hz, more preferably from about 20 Hz to about 1000 Hz, and still more preferably from about 50 Hz to about 200 Hz. Accordingly, the cathodic and anodic pulse widths may vary from about 0.83 microsecond to about 200 milliseconds. Generally, as the feature size decreases or the aspect ratio increases, higher frequencies and or lower cathodic duty cycles are preferred.

Although applicants do not wish to be bound by theory, some considerations regarding the theory of electrodeposition of metal under pulsed current may help to understand the operation of the invention, particularly as to the first step of the process wherein metal is deposited in small recesses.

As indicated above, when a voltage is first applied to an electrolytic cell the concentration of electroreactive species at the surface begins to differ from that in the bulk solution. In particular, if a metal is being deposited or plated onto the surface of an electrode the concentration of metal ions adjacent to the electrode decreases, whereby a concentration gradient is established in the region adjacent to the electrode. Metal ions then diffuse from the bulk electrolyte toward the electrode. After a certain time a steady state is reached in which a layer of depleted concentration of reactive species, e.g., metal ions, adjacent to the electrode surface. This layer is the Nernst diffusion layer. The thickness of the Nernst diffusion layer will evidently depend on the degree of agitation of the electrolyte bath and the magnitude of the current. In a typical electroplating cell using direct current (DC) the Nernst diffusion layer has been found to have a thickness of about 75 micrometers under conventional conditions of bath agitation and electrolyte concentration. Inasmuch as the thickness of the Nernst diffusion layer under steady-state Dc electroplating conditions is determined principally by the electrolyte agitation, it may be referred to as the hydrodynamic diffusion layer.

When pulsed current is used to effect an electrochemical reaction, e.g., metal deposition, at an electrode surface, the layer adjacent the surface can be at least partially replenished by diffusion from the bulk electrolyte during the periods when the cathodic or deposition current is not flowing, specifically during the off-times and the anodic or reverse times. The diffusion layer is then reestablished at the beginning of each pulse. Under such conditions, there will still be a net depletion of reactive species, e.g., within the diffusion layer, but the concentration at the electrode surface and immediately adjacent thereto may fluctuate. A good approximation to the actual conditions has been proposed by Ibl, N., et al., *Surface Technology* 6, p. 287 (1978), wherein the diffusion layer is modeled as a duplex diffusion layer. As illustrated in FIG. 18, the duplex diffusion layer $\delta^N$ comprises an outer steady-state diffusion layer $\delta_s$ and an inner fluctuating diffusion layer $\delta_p$. The thickness of the entire duplex diffusion layer $\delta_N$ is still determined by hydrodynamic conditions and may be considered to be a hydrodynamic diffusion layer. However, the thickness of the inner fluctuating layer $\delta_p$ is principally determined by the parameters of the current pulses, e.g., duration, amplitude and the like. Accordingly, the fluctuating inner diffusion layer may be described as an electrodynamic diffusion layer. Its thickness, as shown in FIG. 18 may be calculated as $$\delta_p = (2Dt_c)^{1/2} \tag{7}$$

where:
$\delta_p$=thickness of the electrodynamic diffusion layer;
D=the diffusion constant for the electroactive species; and
$t_c$=the on-time of the cathodic current pulse.

Figure 7:
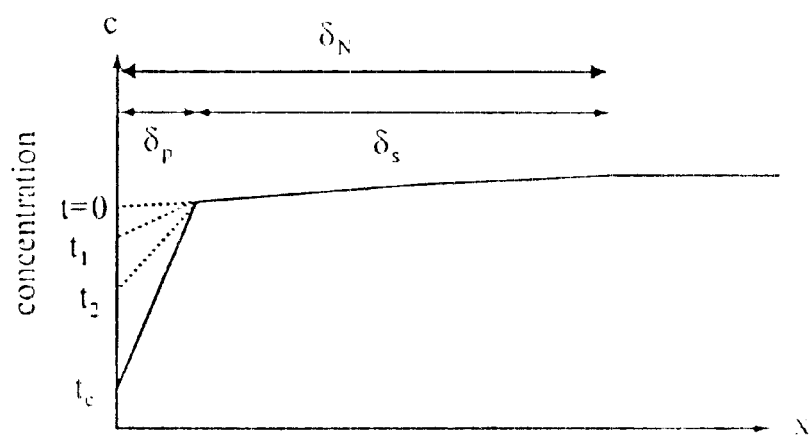
FIG. 7 shows the electrodynamic diffusion layer having a fluctuating concentration of electroactive species close to the surface of the substrate when pulsed current is used.

FIG. 7 illustrates the development of the electrodynamic diffusion layer from the initiation of the pulse at $t_0$, through the intermediate times $t_1$ and $t_2$ to the end of the cathodic pulse at time $t_c$. If the cathodic pulse is long enough, the concentration of the electroactive species, e.g., a metal to be plated, may reach zero at the surface of the the cathodic substrate, with consequences discussed below. The same equation has also been shown to apply to plating with reversed current pulses. It is evident by inspection of equation (7) that the thickness of the electrodynamic diffusion layer is proportional to the square root of the cathodic pulse on-time. Accordingly, the electrodynamic diffusion layer can be made substantially thinner than the steady-state hydrodynamic diffusion layer by using short cathodic pulses.

The relative thickness of the electrodynamic diffusion layer and the time required for it to be established at the surface of a substrate to be electroplated is believed to have an effect on the distribution of the deposited metal in small recesses. The application of such considerations to the electroplating process enables the practitioner to control the distribution of the plated metal within small recesses on the substrate surface.

Metal distribution on a plated substrate is determined by the current distribution. The current distribution is in turn determined, as is well-known, by three principal factors.

1) Geometry of the electrolytic cell (primary current distribution): The flow of current tends to be concentrated at peaks of asperities on the substrate. This primary current distribution favors a nonuniform deposition of metal on the high points or peaks of the substrate surface.

2) Kinetics of the electrode reaction (secondary current distribution): The overpotential produced by the kinetics of the electrode reaction tends to be greater at the peaks of the asperities. This tends to reduce the difference in current density between the peaks and valleys of the substrate surface. Consequently, the distribution of deposited metal under secondary current distribution is more uniform than that under primary current distribution, although it still favors deposition of metal at the peaks of the substrate surface.

3) Mass transport (tertiary current distribution): If the Nernst diffusion layer is substantially thinner than the vertical dimensions of the substrate surface asperities, the diffusion layer will follow the uneven surface, as pointed out above. Consequently, the effect of mass transport across the Nernst diffusion layer will not vary from peak to valley of the substrate surface. However, the current distribution across a microrough surface, i.e., a surface having asperities that are significantly smaller than the thickness of the diffusion layer, will be nonuniform, favoring deposition at the peaks of the microasperities.

The same considerations apply to electrolytic removal of metal from a substrates surface, i.e., by making the surface anodic with respect to a counterelectrode.

In view of the above discussion it will be apparent that the deposition and removal of metal from a substrate surface is in general nonuniform, although the magnitude of the non-uniformity may differ with the conditions prevailing in a particular case.

According to the invention, it is possible to control the conditions for depositing a metal on a substrate having features, e.g., recesses such as vias and trenches, with transverse dimensions of the order of the thickness of the Nernst diffusion layer or smaller, in order to produce an electrodeposited layer of metal on the surface that may conform to the surface features or fill the features with solid metal. In general, according to the invention, by using controlled pulse reverse current (or voltage) it is possible to balance the generally nonuniform processes of plating and removal to yield a deposit that may be conformal or feature-filling.

Generally, the primary current distribution is controlled by the geometry of the plating cell, e.g., electrode spacing and the like. Accordingly, the primary current distribution is not controlled by the waveform of the plating current.

Typically, for substrates with small recesses the secondary current distribution would not be expected to vary greatly between the generally flat surface of the substrate and the walls and bottoms of the trenches, vias, etc. in the surface.

However, the presence or absence, of tertiary distribution and its control can have a significant effect on the deposition and/or removal of metal from the substrate surface when the surface features have dimensions of the order of the Nernst diffusion layer or smaller.

Tertiary or mass transport effects become important when the concentration of reacting species at the electrode surface is small or zero. Under these conditions, as noted above, the rate of deposition of metal is determined by the rate of diffusion through the Nernst diffusion layer. The time required for the diffusion layer to develop can be characterized by the time for the concentration of reacting species at the electrode surface to drop to zero, i.e., the transition time. This transition time is inversely related to the current density by the equation $$\tau=((nF)^2 C_b^2 D)/2 i_c^2 \qquad (8)$$

Where:

τ=transition time n=number of electrons transferred in the electrode reaction

F=the Faraday constant $C_b$=concentration of the electroactive species

D=diffusion constant of the reacting species, e.g., metal ion $i_c$=current density From this equation it may be seen that when the pulse on-time is significantly longer than the transition time, an electrodynamic diffusion layer is established during each pulse, and tertiary effects have a significant influence on the current distribution.

An additional consideration for tertiary current distribution is the relative size of the diffusion layer and surface features. For the macroprofile case (See FIG. 2B), the roughness of the surface is large compared with the thickness of the diffusion layer, and the diffusion layer tends to follow the contour of the surface. Consequently, under mass transport or tertiary control, a macroprofile yields a uniform current distribution and a conformal deposit during plating. An the contrary, under such mass transport control, a microprofile (surface roughness small compared with the thickness of the diffusion layer, FIG. 2A) experiences non-uniform current distribution and consequent non-uniform electrolytic activity.

For a substrate with one or more features having transverse dimensions that are larger than the Nernst diffusion layer established under DC plating conditions, i.e., the hydrodynamic diffusion layer, the distribution of metal is relatively uniform if the current distribution is governed by mass transport, i.e., tertiary cathodic current distribution. If such a surface is plated using pulsed current, the electrodynamic diffusion layer will be somewhat thinner, but the surface still represents a macroprofile. Consequently, at the same average current density, the relative influence of tertiary current distribution control is less, compared to primary current distribution control. The current distribution is therefore less uniform under pulsed current plating, and shorter pulses will, in general, produce a more non-uniform current distribution.

However, the circumstances are different for a substrate according to the invention, having a surface bearing one or more features that are smaller than the DC Nernst (hydrodynamic) diffusion layer, or at least having transverse dimensions of the order of the thickness of the hydrodynamic diffusion layer. The hydrodynamic Nernst diffusion layer does not readily conform to the profile of such a surface. Accordingly, such features are hydrodynamically isolated from the bulk electrolyte. The exact upper limit to the transverse dimensions of features that experience this hydrodynamic isolation is expected to vary somewhat with the exact size, shape and depth of the features. However, it is believed that effects due to hydrodynamic isolation may be experienced in the case of features having transverse dimensions smaller than about 350 micrometers.

Such substrate surfaces accordingly present a microprofile with respect to the hydrodynamic diffusion layer. If electroplated under conditions that produce tertiary current distribution, a non-uniform metal deposit will occur. However, if the cathodic plating current is pulsed, the electrodynamic diffusion layer is substantially thinner, as pointed out above. Accordingly, the surface profile may be converted into an effective macroprofile, while maintaining tertiary current distribution conditions, which favors a uniform or conformal coating of metal.

Conversely, if the cathodic, or forward, pulse is followed by an anodic, or reverse, pulse, metal is removed from the substrate. However the metal removal should be conducted under primary and secondary control conditions and tertiary control conditions, i.e., control by mass transport across a diffusion layer, should be avoided, in order to assure a non-uniform removal of metal from the substrate. Under these conditions metal deposited during the cathodic pulse will be removed preferentially from the portions of the substrate closest to the counterelectrode, that is, from the generally planar portion of the substrate surface outside of recesses. The primary and secondary control during the anodic pulse is achieved by using a relatively low current which results in a long transition time from the beginning of the anodic pulse until the establishment of tertiary control, as indicated by Equation 8 above. It may even be possible to choose conditions of anodic pulse on-time and current that avoid the formation of an electrodynamic diffusion layer during the anodic pulse. The duration of the anodic pulse may be adjusted to achieve appropriate deplating conditions, i.e., primary and secondary control and removal of as much metal as is convenient before the next cathodic pulse occurs. Evidently, some experimentation will be required in a particular case to discover the best combination of anodic pulse current and on-time to achieve the most uniform plating of the substrate at the best overall plating rate for the portions of the substrate surface that have the small recesses, such as those discussed above. However, the skilled practitioner, taught by the above disclosure and the examples, will be able to select appropriate combinations of current and on-time for the cathodic and anodic pulses in order to achieve the desired metal plating on the substrate in the first step of the process in which metal is deposited into the small recesses of the circuit board.

Accordingly, in the first step of the process of the invention the on-time of the cathodic pulse may range from about 0.83 microseconds to about 100 milliseconds, preferably from about 1 $\mu$s to about 10 milliseconds, more preferably from about 1.7 $\mu$s to about 5 milliseconds, and still more preferably from about 2.5 $\mu$s to about 1 millisecond. The anodic pulse is longer than the cathodic pulse and may range from about 42 $\mu$s to about 99 milliseconds, preferably from about 50 $\mu$s to about 19.8 milliseconds, more preferably from about 84 $\mu$s to about 9.9 milliseconds, and still more preferably from about 125 $\mu$s to about 1.98 milliseconds. Although the duty cycle of the anodic pulse will typically be greater than 50%, it is not excluded that in some circumstances the anodic pulse may have a duty cycle less than 50%, provided that it satisfies the above-described condition that its duration be longer than that of the cathodic pulse.

In the second step of the process of the invention the on-time of the cathodic pulse may range from about 0.12 milliseconds to about 198 milliseconds, preferably from about 0.14 milliseconds to about 170 milliseconds, and more preferably from about 0.14 milliseconds to about 160 milliseconds. The anodic pulse is shorter than the cathodic pulse and may range from about 2 $\mu$s to about 60 milliseconds, preferably from about 30 $\mu$s to about 60 milliseconds, and more preferably from about 40 $\mu$s to about 60 milliseconds. A pulse train featuring a combination of pulses according to the invention, having different cathodic and anodic on-times adapted to the various features of the substrate may also be used in practicing the invention, particularly in the first step of the process.

Although the invention has been described above in terms of a process in which the hydrodynamically inaccessible recesses are plated in a first step and the hydrodynamically accessible recesses are plated in a second step, it is not necessary that the different size recesses be plated in successive steps. The pulse trains appropriate for depositing metal in hydrodynamically isolated features, used in the first step of the embodiment of the process described above, will favor deposition in such features even when applied in very short pulse trains or even individual pulses. Similarly, the pulse trains appropriate for depositing metal in hydrodynamically accessible features, used in the second step of the embodiment described above, will favor deposition in such features even when applied in very short pulse trains or even individual pulses. Accordingly, in another embodiment of the method of the invention, the pulse trains used in the first step, i.e., comprising first cathodic and first anodic pulses, and the pulse trains used in the second step, i.e., comprising first cathodic and first anodic pulses, may be intermixed. It is not necessary to carry the first step of the process to complete filling of the smaller features before performing at least a portion of the second step to preferentially deposit metal in the larger features of the substrate. Thus, a short train of pulses according to the first step of the process, e.g., a pulse train lasting a few minutes, may be followed by a train of pulses according to the second step of the process lasting a similar period of time, and then the alternation of first and second anodic and cathodic pulses may be continued until the substrate is satisfactorily plated. It is not excluded that the pulse trains according to the first and second step may be as short as a few seconds or even that individual pulse pairs according the first step and second step may be applied alternately to the substrate, so that both steps of the process are carried out concurrently, i.e., both hydrodynamically inaccessible recesses and hydrodynamically accessible recesses are plated at the same time. It is even possible to mix pulse trains comprising several cathodic pulses of the first type and second type followed by anodic pulses of the first and second type. The skilled practitioner will recognize, however, that, because the pulses of the second type, i.e., appropriate for plating the hydrodynamically accessible recesses, tend to bridge the small, i.e., hydrodynamically isolated recesses, the mix of pulses must be adjusted to avoid blocking or bridging the hydrodynamically isolated recesses before they are filled to the extent desired.

Furthermore, such a mixed process is especially useful when used with a plating bath that is devoid of the conventional levelers and/or brighteners that are customarily used to assure effective filling of recesses such as vias and through-holes.

In DC electroplating it is conventional to counteract the tendency of the metal to be deposited preferentially at the peaks of the surface asperities by adding certain chemicals to the plating bath to improve its "throwing power." These additives help to produce a level coating of the metal. However, experience with such additives has been generally confined to electroplating onto macrorough substrates, and their mode of operation is not entirely understood. The additives are used in small amounts, and different applications have typically used different formulations. Consequently, the effectiveness of such additives for producing a uniform deposit of metal in small recesses cannot be predicted, and it would be expected that development of additives suitable for enhancing throwing power under these conditions would require extensive experimentation. Furthermore, because very small concentrations of additives are used, the measurement and control or replenishment of the additive concentration presents substantial difficulties. Finally, the additives may be occluded within the metal deposit. Such inclusions may cause increased resistance and quality control problems. The use of conventional plating bath additives is not excluded in the process of the invention, but it is preferred to minimize their use to avoid the problems indicated above.

These different classes of materials are included in the plating bath in order to achieve certain characteristics of the deposit, and their terminology reflects the purpose for which they are used. These materials are included in the plating bath for specific purposes, and the terminology used to identify them generally describes the effect that they produce. The purpose of these material and their nomenclature is summarized in Mikkola et al., Plating and Surface Finishing, March 2000, pages 81–85, the entire disclosure of which is incorporated herein by reference.

In many metal plating baths small amounts of organic compounds are added, typically in concentrations of a few parts per million, in order to achieve a bright, shiny surface on the deposited metal. Such compounds, generally referred to as brighteners, tend to produce an even, fine-grained deposit, and are thought to operate by their effect on the nucleation of the metal grains. These compounds typically contain sulfur and other functional groups, and include such compounds as thiourea, and derivatives thereof, mercaptopropane sulfonic acid and the like.

A second class of additive compounds, also present in small amounts (typically a few parts per million), are those that produce a level deposit ("levelers"), i.e., a smooth deposit that fills in microscopic irregularities in the plating substrate. They are believed to operate by selective adsorption to readily accessible surfaces such as protruding high points or flat surfaces, whereby they decrease the rate of electrodeposition at those locations. Such compounds include polyamines, derivatives of safronic dyes, and the like.

Both the brighteners and levelers are consumed in the course of electroplating. Consequently, their concentration must me monitored and controlled by periodic additions. Because the concentrations are low and the amounts to be added are small, the control of the brightener and leveler concentrations presents some problems for the electroplater.

Another type of compound that is included in the bath for certain metals is generally known as a carrier or suppressor. Such compounds are typically used with metals that are plated efficiently, such as copper and zinc. They are believed to have a beneficial effect on the grain size of the deposit because they are adsorbed to the surface and decrease the rate of deposition. Such compounds are typically present in a concentration substantially greater than that of the brighteners and levelers, typically 100 parts per million or greater. Accordingly, it is significantly easier to control the concentration of a carrier compound than of a leveler or brightener. Suppressors or carriers include polyhydroxy compounds such as polyglycols, e.g., poly(ethylene glycol), poly(propylene glycol), and copolymers thereof.

Improved control of the plating deposit over that achievable using with DC plating and conventional plating bath additives is possible because it is also possible to control the deposition of metal by using a modulated electric field.

According to the invention, it has been found that it is possible to dispense with the levelers and brighteners and still achieve uniform filling of small recesses, such as trenches and vias, in circuit board substrates intended for use in high density interconnect circuits. For depositing copper in such small recesses it is still useful to use a carrier (or suppressor) compound, in a concentration of from about 100 parts per million to about 5% by weight of the plating bath. A preferred suppressor compound is poly(ethylene glycol), and a preferred concentration is from about 200 parts per million (ppm) to about 800 parts per million by weight, more preferably about 300 parts per million by weight. The poly(ethylene glycol) may range in molecular weight from about 1000 to about 12000, preferably from about 2500 to about 5000. The suppressor is typically used in combination with chloride ion in a concentration of about 40–200 parts per million by weight, preferably about 50 parts per million by weight. Therefore, it is in accordance with the invention to deposit a metal by electrodeposition into hydrodynamically inaccessible recesses and hydrodynamically accessible recesses during fabrication of circuit boards having a combination of such recesses using modulated reversing electric fields adapted to plate each type of recess preferentially as described herein, using a plating bath that is substantially devoid of levelers and/or brighteners.

The method of the invention may be used with any metal that can be deposited by electroplating techniques. Thus copper, silver, gold, zinc, chromium, nickel, tin, lead and alloys thereof such as bronze, brass, solder, and the like, may be deposited by the process of the invention.

Figure 3A:
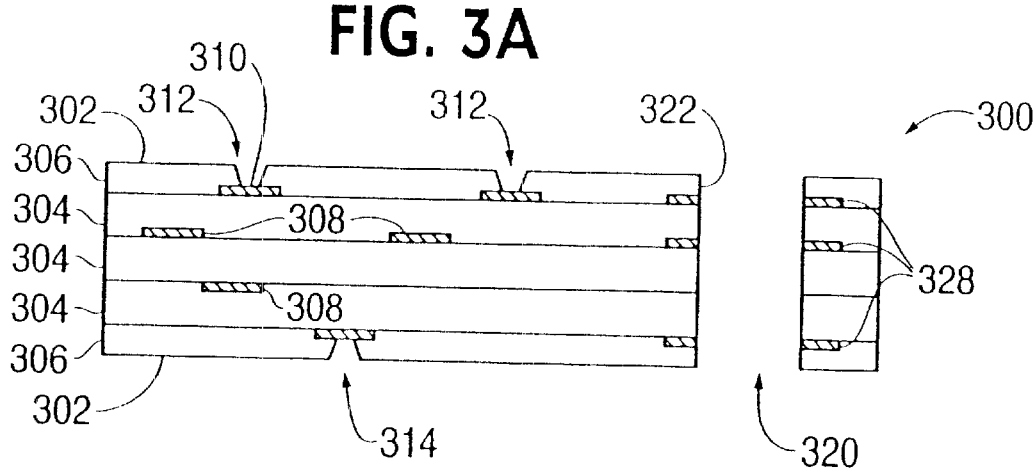
FIG. 3A illustrates a cross section of a circuit board having both an HDI area and a PWB area before the first metallization step of the process of the invention.
Figure 3B:
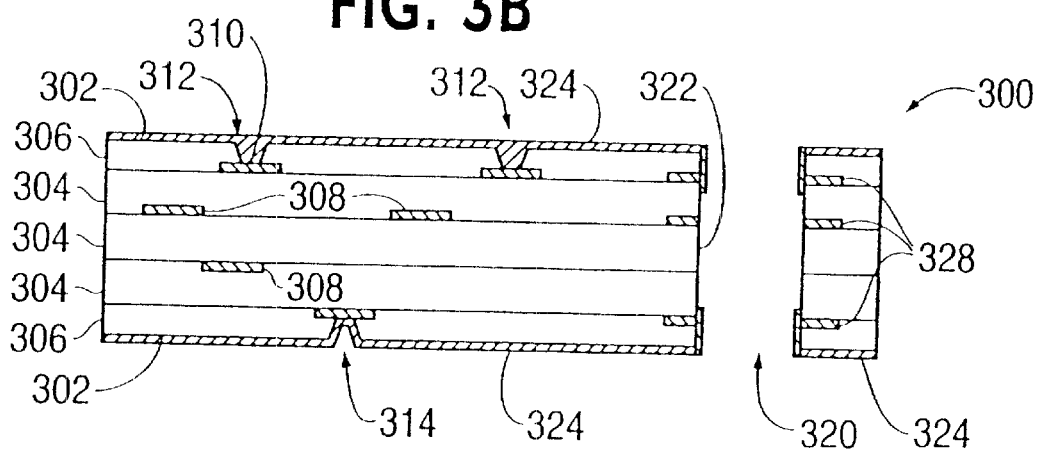
FIG. 3B illustrates a cross section of a circuit board having both an HDI area and a PWB area after the first metallization step of the process of the invention.
Figure 3C:
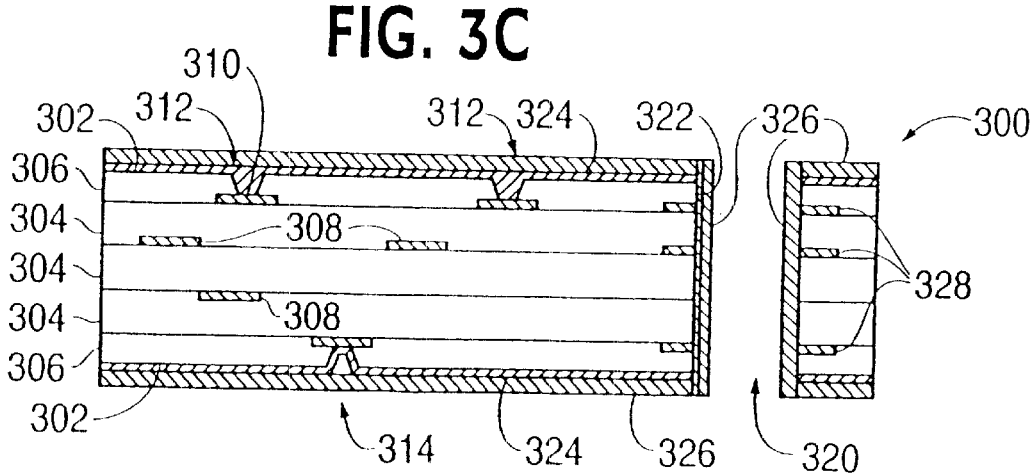
FIG. 3C illustrates a cross section of a circuit board having both an HDI area and a PWB area after the second metallization step of the process of the invention.

The deposition of a metal on a circuit board having both small vias and large through-holes is illustrated in FIGS. 3A–3C.

FIG. 3A illustrates a cross section of a multi-layer circuit board 300 having features of different sizes to be plated with metal by the process of the invention. The surfaces 302 of the board 300 are to be plated with an electrically conductive metal, e.g., copper, which can be subsequently masked and etched to provide conductive traces on the surfaces 302 of the board 300. The illustrated board has five layers of dielectric material 304, 306, although it will be understood by those skilled in the art that boards having any conventional number of layers can be used. Typically the inner dielectric layers 302 will be a reinforced material such as glass fiber reinforced epoxy resin. The outer layers 304 may be an unreinforced material, e.g., unreinforced epoxy resin, to permit easier drilling of vias. The board 300 may contain a number of conducting paths formed at the interfaces between the layers 304, 306. These conductors are shown in cross-section as conductors fully buried conductors 308 and conductors 310 to be connected to the surface 302 of the board 300. Vias 312, 314 are formed in the outer dielectric layers 306 to provide for connecting the conductors 310 to pattern of conductive traces on the surface of the finished circuit board. The circuit board 300 may contain through-holes, one of which is shown as 320, which are intended to be metallized to connect the conductors on the surface 302 to buried pads 328.

In order to prepare for the deposition of the copper layer, the surfaces to be plated, e.g., the surfaces 302, the interior surfaces of the vias 312, 314 and the inside of the through-hole 314 are covered with a thin layer of a conductor by conventional procedures, e.g., by sputtering, electroless deposition, or the like.

Circuit board 300 is then immersed in a plating bath containing ions of a metal to be deposited, e.g., copper ions. The plating bath may be any conventional plating bath appropriate for the metal being plated. Typically plating baths for depositing copper contain a copper salt, e.g., copper sulfate, sulfuric acid, a carrier material that is typically a polyethylene glycol, chloride ion, and one or more proprietary additives generally known as brighteners, levelers, and the like, to improve the uniformity, surface finish, and strength of the deposited coating. Although the process of the invention can be carried out using conventional copper plating baths, it has been found that satisfactory copper deposits can be achieved using a bath that does not include the conventional brighteners, levelers, and the like. Accordingly, for electroplating copper onto an HDI substrate, particularly when small traces and vias are to be prepared, it is preferred to avoid conventional additives such as leveling agents and the like, in order to avoid the difficulties of using such additives such as the tight control of concentration of said additives as well as possible inclusion in the plated conductors. A preferred bath for electroplating copper according to the process of the invention is an aqueous acidic copper sulfate bath incorporating about 40 to about 80 g/L of copper sulfate, a molar ratio of sulfuric acid to copper sulfate of about 5:1 to about 8:1, about 5% of polyethylene glycol and about 30 ppm to about 60 ppm of chloride ion.

An electric current is then passed between the circuit board and a counterelectrode immersed in the plating bath by imposing a modulated reversing electric field to deposit the metal, e.g., copper, on the surfaces of the board 300.

In the first step of the process the current is a pulsed reversing current as discussed above, having relatively short cathodic pulses, i.e., having a duty cycle less than about 50% and long anodic pulses, i.e., having a duty cycle greater than about 50%. Such a pulsed reversing current will produce a layer of plated copper 324 that will provide a conductive path between the vias on the surface 302 of the board 300. By adjusting the time of plating and, if necessary, the peak current, pulse duration, duty cycle and frequency of the modulated reversing current, the deposit in the first step can provide a conformal coating in the vias as shown at 314 or may completely fill the vias, as shown at 312. Both types of coating in the vias are shown for illustrative purposes, although in general only one type will be deposited in a given application of the process.

The pulsed reversing current having the waveform used in the first step of the process will typically deposit a relatively thin layer of conductive metal over the surface 302 of the board 300, and will deposit little or no metal on the inner surface 322 of the through-hole 320. Accordingly, after the vias have been metallized, a second plating step is performed using a waveform that will deposit a uniform layer of conductive metal over the surfaces 302 of the board 300 and also on the interior surface 322 of the through hole 320. As discussed above, the pulsed reversing current used in the second step of the process of the invention comprises cathodic pulses having a relatively long duty cycle, typically greater than about 50% and the anodic pulses have a duty cycle typically greater than about 50%. Preferably the cathodic pulses in the second step of the process have a duty cycle of about 60% to about 99%, more preferably from about 70% to about 95% and still more preferably from about 85% to about 95%. The anodic pulses in the second step of the process preferably have a duty cycle of from about 1% to about 40%, more preferably from about 5% to about 30% and more preferably from about 5% to about 15%. FIG. 3C shows a schematic cross section of the circuit board 300 after the second step of the process. A uniform layer 326 of copper has been deposited over the first layer 324 and onto the inner surface 322 of the through-hole 320. The uniformly plated board 300 can then be masked, imaged and etched by conventional procedures to provide conductive traces on the surfaces 302 of the board 300.

EXAMPLE

This example illustrates the preparation of a substrate having filled vias and a uniform surface deposit of copper by the process of the invention.

In order to provide a substrate having vias and through holes similar to those found in a multi-layer circuit board, small blind holes having a diameter of about 75–100 micrometers were drilled in the surface of a brass panel having dimensions of 18 inches×8 inches using a laser. Through holes having a diameter of about 325 micrometers were also made in the plate using a mechanical drill. The plate was mounted in a conventional industrial circuit board electroplating apparatus and plated in two steps according to the invention.

The plating bath had the following composition: 60–65 g/L of copper sulfate, 166 g/L of sulfuric acid, about 50 parts per million (ppm) of chloride ion, and about 300 ppm of polyethylene glycol (PEG).

In the first step of the plating process the pulsed reversing electric current had the following characteristics: cathodic duty cycle, 33%; anodic duty cycle, 67%; average cathodic current density, 25 amperes per square foot (ASF), frequency of pulse train, about 333 Hz, and cathodic/anodic charge ratio ($Q_c/Q_a$), 2.5. The plating was conducted for a period of 3 hours in the first step.

The second step of the plating process was then conducted by merely changing the waveform of the plating current. The bath was not changed, the board was not removed from the plating apparatus and no other processing steps were conducted.

In the second step of the plating process the pulsed, reversing electric current had the following characteristics: cathodic duty cycle, 90%; anodic duty cycle, 10%; average cathodic current density, 25 amperes per square foot (ASF), frequency of pulse train, about 100 Hz, and cathodic/anodic charge ratio (Qc/Qa), 10. The plating was conducted for a period of 1 hour in the second step.

Figure 4:
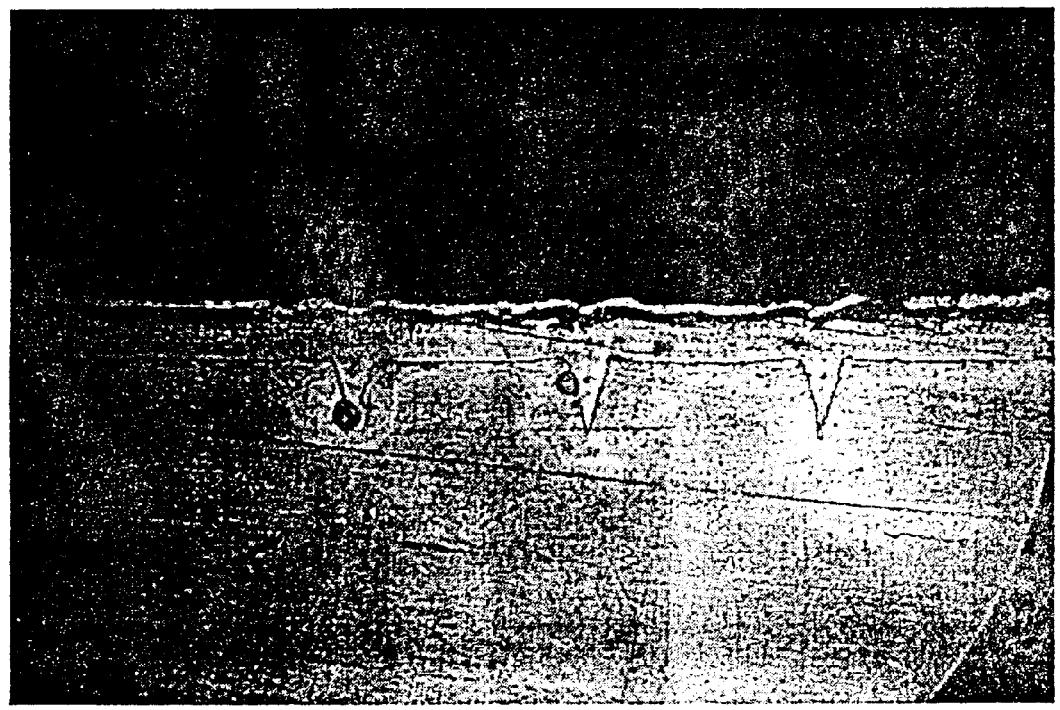
FIG. 4 is a photomicrograph of a cross section of a brass substrate having vias with a transverse dimension of about 75–100 micrometers after a first plating step according to the process of the invention.
Figure 5:
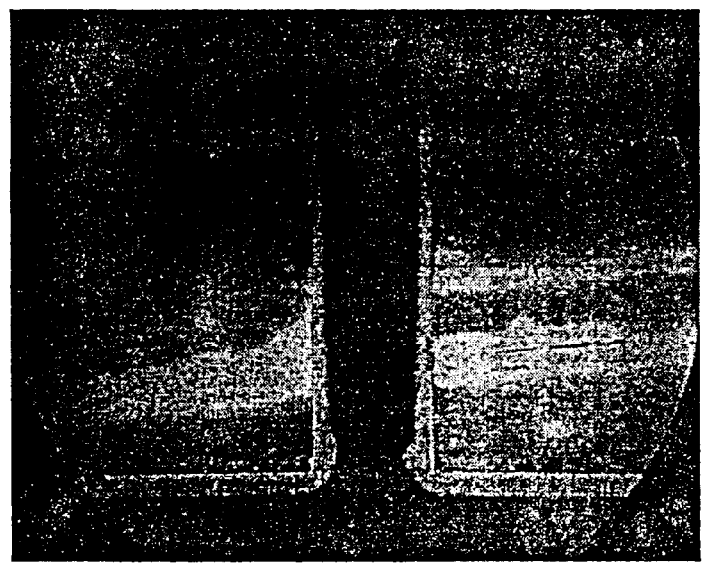
FIG. 5 is a photomicrograph of a cross-section of the brass substrate having a through-hole with a diameter of about 325 micrometers at one end of the hole after the substrate has been treated with both steps of the process of the invention.
Figure 6:
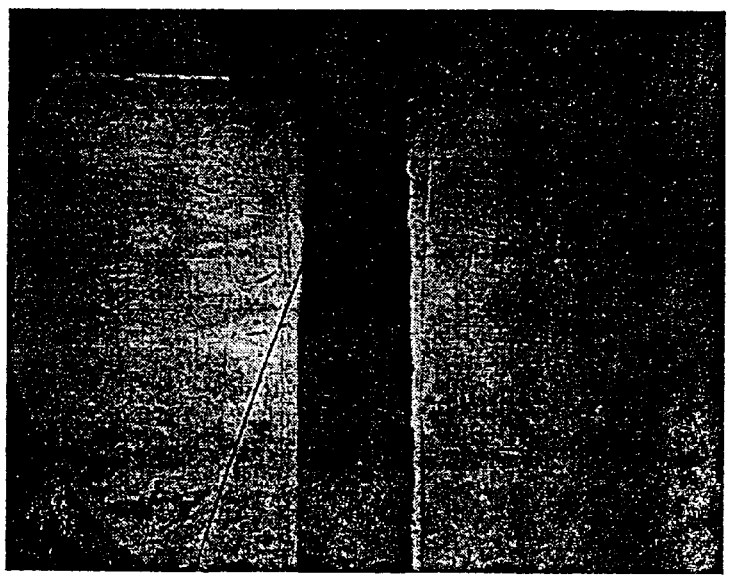
FIG. 6 is a photomicrograph of a cross-section of the brass substrate having a through-hole with a diameter of about 325 micrometers at the other end of the hole after the substrate has been treated with both steps of the process of the invention.

The results achieved are illustrated in FIGS. 4–6. FIG. 4 is a photomicrograph of a cross-section of the plated substrate showing the vias filled with deposited copper. (Certain defects in the brass test panel are also visible.) FIGS. 5 and 6 are photomicrographs showing cross sections of the substrate at each end of the through hole showing a generally uniform plating of the surface of the substrate and the interior surface of the through-hole, with minimum excessive plating ("dogboning") at the edge of the hole.

The invention having now been fully described, it should be understood that it may be embodied in other specific forms or variations without departing from its spirit or essential characteristics. Accordingly, the embodiments described above are to be considered in all respects as illustrative and not restrictive, the scope of the invention being indicated by the appended claims rather than the foregoing description, and all changes which come within the meaning and range of equivalency of the claims are intended to be embraced therein.

We claim:

1. A method for depositing a continuous layer of a metal onto a substrate having both hydrodynamically inaccessible recesses and hydrodynamically accessible recesses on its surface comprising, immersing, as an electrode, an electrically conductive substrate having a generally smooth surface having at least one hydrodynamically inaccessible recess and at least one hydrodynamically accessible recess in said surface in an electroplating bath containing ions of a metal to be deposited onto said surface, said electroplating bath being substantially devoid of at least one additive selected from the group consisting of levelers and brighteners;

immersing a counterelectrode in said plating bath;

preferentially depositing metal into said hydrodynamically isolated recesses by passing a first modulated reversing electric current between said electrodes, wherein said first modulated reversing electric current comprises a first pulse train of first cathodic pulses and first anodic pulses, with respect to said electrically conductive substrate, the charge transfer ratio of said first cathodic pulses to said first anodic pulses is greater than one, said first cathodic pulses have an on-time ranging from about 0.83 microseconds to about 200 milliseconds, and said first anodic pulses have an on-time greater than the on-time of said first cathodic pulses and ranging from about 42 microseconds to about 198 milliseconds; and preferentially depositing metal into said hydrodynamically accessible recesses by passing a second modulated reversing electric current between said electrodes, wherein said second modulated reversing electric current comprises a second pulse train of second cathodic pulses and second anodic pulses, the charge transfer ratio of said second cathodic pulses to said second anodic pulses is greater than one, said second cathodic pulses have an on-time ranging from about 0.12 milliseconds to about 198 milliseconds, said second anodic pulses have an on-time shorter the on-time of said second cathodic pulses and ranging from about 2 microseconds to about 60 milliseconds.

2. The method of claim 1, wherein an interval of no electric current flow is interposed between said cathodic pulses and succeeding anodic pulses.

3. The method of claim 1, wherein an interval of no electric current flow is interposed between said anodic pulses and succeeding cathodic pulses.

4. The method of claim 1, wherein an interval of no electric current flow is interposed between said cathodic pulses and succeeding anodic pulses and between said anodic pulses and succeeding cathodic pulses.

5. The method of claim 1, wherein, in said first pulse train, said cathodic pulses and said anodic pulses succeed each other without intervening intervals of no electric current flow.

6. The method of claim 1, wherein, in said first pulse train, said cathodic pulses have an on-time ranging from about 1 microsecond to about 10 milliseconds.

7. The method of claim 1, wherein, in said first pulse train, said cathodic pulses have an on-time ranging from about 1.7 microseconds to about 5 milliseconds.

8. The method of claim 1, wherein, in said first pulse train, said cathodic pulses have an on-time ranging from about 2.5 microseconds to about 1 millisecond.

9. The method of claim 1, wherein, in said first pulse train, said anodic pulses have an on-time ranging from about 50 microseconds to about 19.8 milliseconds.

10. The method of claim 1, wherein, in said first pulse train, said anodic pulses have an on-time ranging from about 84 microseconds to about 9.9 milliseconds.

11. The method of claim 1, wherein, in said first pulse train, said anodic pulses have an on-time ranging from about 125 microseconds to about 1.98 milliseconds.

12. The method of claim 1, wherein the frequency of said first pulse train is between about 5 Hertz and about 12000 Hertz.

13. The method of claim 1 wherein wherein the frequency of said first pulse train is between about 100 Hertz and about 10000 Hertz.

14. The method of claim 1 wherein wherein the frequency of said first pulse train is between about 200 Hertz and about 4000 Hertz.

15. The method of claim 1 wherein wherein the frequency of said first pulse train is between about 200 Hertz and about 2000 Hertz.

16. The method of claim 1 wherein, in said first pulse train, said cathodic pulses have a duty cycle of from about 30% to about 1%.

17. The method of claim 1 wherein, in said first pulse train, said cathodic pulses have a duty cycle of from about 30% to about 15%.

18. The method of claim 1 wherein, in said first pulse train, said cathodic pulses have a duty cycle of from about 30% to about 20%.

19. The method of claim 1 wherein, in said first pulse train, said anodic pulses have a duty cycle of from about 60% to about 99%.

20. The method of claim 1 wherein, in said first pulse train, said anodic pulses have a duty cycle of from about 70% to about 85%.

21. The method of claim 1 wherein, in said first pulse train, said cathodic pulses have a duty cycle of from about 70% to about 80%.

22. The method of claim 1, wherein, in said second pulse train, said cathodic pulses have an on-time ranging from about 0.14 milliseconds to about 170 milliseconds.

23. The method of claim 1, wherein, in said second pulse train, said cathodic pulses have an on-time ranging from about 0.14 milliseconds to about 160 milliseconds.

24. The method of claim 1, wherein, in said second pulse train, said anodic pulses have an on-time ranging from about 2 microseconds to about 60 milliseconds.

25. The method of claim 1, wherein, in said second pulse train, said anodic pulses have an on-time ranging from about 30 microseconds to about 60 milliseconds.

26. The method of claim 1, wherein, in said second pulse train, said anodic pulses have an on-time ranging from about 40 microseconds to about 60 milliseconds.

27. The method of claim 1, wherein said second pulse train has a frequency between about 5 Hertz and about 4000 Hertz.

28. The method of claim 1, wherein said second pulse train has a frequency between about 10 Hertz and about 2500 Hertz.

29. The method of claim 1, wherein said second pulse train has a frequency between about 20 Hertz and about 1000 Hertz.

30. The method of claim 1, wherein said second pulse train has a frequency between about 50 Hertz and about 200 Hertz.

31. The method of claim 1, wherein, in said second pulse train, said cathodic pulses have a duty cycle of from about 60% to about 99%.

32. The method of claim 1, wherein, in said second pulse train, said cathodic pulses have a duty cycle of from about 70% to about 95%.

33. The method of claim 1, wherein, in said second pulse train, said cathodic pulses have a duty cycle of from about 80% to about 95%.

34. The method of claim 1, wherein, in said second pulse train, said anodic pulses have a duty cycle of from about 40% to about 1%.

35. The method of claim 1, wherein, in said second pulse train, said anodic pulses have a duty cycle of from about 30% to about 5%.

36. The method of claim 1, wherein, in said second pulse train, said anodic pulses have a duty cycle of from about 20% to about 5%.

37. The method of claim 1, wherein said metal is selected from the group consisting of copper, silver, gold, zinc, chromium, nickel, tin, lead, bronze, brass, solder, and alloys thereof.

38. The method of claim 1, wherein said hydrodynamically inaccessible recess has at least one transverse dimension not greater than about 350 micrometers.

39. The method of claim 1, wherein at least one transverse dimension of said hydrodynamically inaccessible recess is from about 5 micrometers to about 350 micrometers.

40. The method of claim 1, wherein at least one transverse dimension of said hydrodynamically inaccessible recess is from about 10 micrometers to about 250 micrometers.

41. The method of claim 1, wherein at least one transverse dimension of said hydrodynamically inaccessible recess is from about 25 micrometers to about 250 micrometers.

42. The method of claim 1, wherein at least one transverse dimension of said hydrodynamically inaccessible recess is from about 50 micrometers to about 150 micrometers.

43. The method of claim 1 wherein in said first pulse train said first cathodic pulses have a duty cycle less than about 50% and said first anodic pulses have a duty cycle greater than about 50%.

44. The method of claim 1 wherein in said first pulse train said first cathodic pulses have an on-time and current density selected to produce electrodeposition under predominantly tertiary control and said first anodic pulses have an on-time and current density selected to produce electroremoval of metal under predominantly primary and secondary control.

45. The method of claim 1 wherein said plating bath is substantially devoid of brighteners.

46. The method of claim 1 wherein said plating bath is substantially devoid of levelers.

47. The method of claim 1 wherein said plating bath is substantially devoid of brighteners and levelers.

48. The method of claim 1 wherein said metal is copper and said plating bath contains a suppressor.

49. The method of claim 48, wherein said suppressor is present in an amount of from about 100 parts per million to about 5% by weight of said plating bath.

50. The method of claim 48, wherein said suppressor is present in an amount of from about 200 parts per million to about 800 parts per million by weight of said plating bath.

51. The method of claim 48, wherein said suppressor is present in an amount of about 300 parts per million by weight of said plating bath.

52. The method of claim 48, wherein said suppressor is an organic polyhydroxy compound.

53. The method of claim 48, wherein said suppressor is poly(ethylene glycol).

54. The method of claim 48, wherein said poly(ethylene glycol) has a molecular weight in the range of from about 1000 to about 12000.

55. The method of claim 48, wherein said poly(ethylene glycol) has a molecular weight in the range of from about 2500 to about 5000.

56. The method of claim 48, wherein said bath contains chloride ion in a concentration of about 40 parts per million by weight to about 200 parts per million by weight.

57. The method of claim 48, wherein said bath contains chloride ion in a concentration of about 50 parts per million by weight.

* * * * *

UNITED STATES PATENT AND TRADEMARK OFFICE
CERTIFICATE OF CORRECTION

PATENT NO. : 6,652,727 B2
DATED : November 25, 2003
INVENTOR(S) : E. Jennings Taylor et al.

It is certified that error appears in the above-identified patent and that said Letters Patent is hereby corrected as shown below:

<u>Column 19,</u>
Lines 44, 47 and 50, delete the word "wherein" (second occurrence).

Signed and Sealed this

Third Day of February, 2004

JON W. DUDAS
*Acting Director of the United States Patent and Trademark Office*